United States Patent
Kneisel et al.

(10) Patent No.: US 6,838,623 B2
(45) Date of Patent: Jan. 4, 2005

(54) ELECTRICAL CIRCUIT BOARD AND A METHOD FOR MAKING THE SAME

(75) Inventors: Lawrence Kneisel, Novi, MI (US); Mohan Paruchuri, Canton, MI (US); Vivek Jairazboy, Farmington Hills, MI (US); Vladimir Stoica, Farmington Hills, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 50 days.

(21) Appl. No.: 10/300,049

(22) Filed: Nov. 20, 2002

(65) Prior Publication Data

US 2003/0102152 A1 Jun. 5, 2003

Related U.S. Application Data

(62) Division of application No. 09/651,765, filed on Aug. 30, 2000, now Pat. No. 6,495,053.

(51) Int. Cl.[7] .............................................. H05K 1/03
(52) U.S. Cl. ...................... 174/255; 174/259; 174/262; 174/263; 361/792
(58) Field of Search ................................ 174/255, 256, 174/257, 258, 259, 262, 263, 264, 261; 361/792, 795

(56) References Cited

U.S. PATENT DOCUMENTS

| | | | | |
|---|---|---|---|---|
| 4,868,350 A | * | 9/1989 | Hoffarth et al. | 174/266 |
| 5,129,142 A | * | 7/1992 | Bindra et al. | 29/852 |
| 5,640,761 A | * | 6/1997 | DiStefano et al. | 29/830 |
| 5,819,401 A | * | 10/1998 | Johannes et al. | 29/830 |
| 5,876,842 A | * | 3/1999 | Duffy et al. | 428/209 |

* cited by examiner

*Primary Examiner*—David A. Zarneke
*Assistant Examiner*—J B Patel
(74) *Attorney, Agent, or Firm*—Brinks Hofer Gilson & Lione

(57) ABSTRACT

A multi-layer electronic circuit board design 10 having selectively formed apertures or cavities 26, and which includes grooves or troughs 20, 22 which are effective to selectively entrap liquefied adhesive material, thereby substantially preventing the adhesive material from entering the apertures 26.

16 Claims, 4 Drawing Sheets

ELECTRICAL CIRCUIT BOARD AND A METHOD FOR MAKING THE SAME

This is a division of application Ser. No. 09/651,765, filed Aug. 30, 2000, now U.S. Pat. No. 6,495,053.

(1) FIELD OF THE INVENTION

The present invention relates to an electrical circuit board and more particularly, to a multi-layer electrical circuit board having multiple circuit interconnections and having apertures and/or cavities which are formed within the circuit board and/or through various portions of the circuit board and which have improved solder-wetting characteristics.

(2) BACKGROUND OF THE INVENTION

Multi-layer circuit boards contain and/or include electrical components which selectively and operatively populate opposed first and second surfaces (i.e., top and bottom surfaces) of each board (or other respective interior portions of each of the boards), thereby desirably allowing each of the electrical circuit boards to contain and/or include a relatively large amount of electrical components which efficiently and densely populate the respective boards.

It is desirable to allow for communication by and between and/or interconnection of the component containing surfaces and/or portions of an electrical circuit board, thereby allowing the contained electrical components on each side of the board (or within certain interior portions of the board) to cooperatively and selectively interconnect to form one or more desired electrical circuits. This communication and interconnection may require the use of shared electrical ground planes, the transmittal of electrical power and/or control type signals between each of the component containing surfaces and/or the component containing board portions, and/or the selective and physical connection of various contained components.

This desired interconnection typically requires one or more holes or cavities to be drilled and/or formed through one or more layers of the circuit board, thereby selectively creating one or more vias (i.e., holes which pass through some or all of the opposed component containing surfaces) which can be used to selectively connect various portions or layers of the circuit board. The vias are then typically filled with solder (e.g., a pin or component connector is soldered into the hole) In this manner, electrical connections are made or formed which connect electrical components and/or circuitry to the core of the circuit board substrate, to other circuit board layers, or to other components and/or circuitry located on the opposing side or surface of the board.

One drawback with these conventional vias is that layers of relatively non-solderable material (i.e., material which does not substantially bind or metallurgically bond with solder) are typically present within these vias, and thus, the solder does not consistently and reliably electrically connect the desired layers of circuitry and/or components together. For example and without limitation, many conventional multi-layer circuit boards include adhesive material or film which is used to couple portions of the circuit boards together. This adhesive film or material is often disposed adjacent to or in relative close proximity to a via and often softens and flows into the via when the circuit board substrate is laminated, thereby causing soldering defects in the subsequent circuit board construction processes. For example and without limitation, the adhesive which flows into the via often flows over or covers portions of the conducting surfaces or layers within the via (e.g., the bottom layer or surface of the via), thereby often preventing the solder from "wetting" or metallurgically bonding to the core or bottom layer of the circuit board. This results in a defective portion or region of the circuit board where all layers of the circuit board are not desirably interconnected.

There is therefore a need for a multi-layer electrical circuit board which overcomes some or all of the previously delineated drawbacks of prior circuit boards and which includes improved vias or cavities for selectively interconnecting one or more layers of electrical circuitry.

SUMMARY OF THE INVENTION

It is a first object of the present invention to provide a method for producing a multi-layer electrical circuit board which overcomes some or all of the previously delineated drawbacks of prior multi-layer electrical circuit board forming methodologies and techniques.

It is a second object of the present invention to create a multi-layer circuit board having vias, apertures or cavities which provide highly reliable and solderable interconnections by eliminating the flow effects of adhesive materials that are used to form the circuit board.

It is a third object of the present invention to provide a method for producing a multi-layer electrical circuit board which overcomes some or all of the previously delineated drawbacks of prior multi-layer electrical circuit board forming methodologies and techniques and which allows for the selective, efficient, and reliable formation of apertures or cavities which allow for communication by and between some or all of the various component containing surfaces and portions of the formed multi-layer electrical circuit board, which selectively allow components contained within and/or upon these portions and surfaces to be interconnected, and which is further adapted to selectively and communicatively receive an electrical component and/or an electrical component connector portion.

According to a first aspect of the present invention, a circuit board assembly including an aperture in which certain electrical connections can be made is provided. The circuit board assembly includes a first circuit board portion including a first conductive member having a top surface; a second circuit board portion having a bottom surface and a first region which forms a portion of the aperture; an adhesive material which is at least partially disposed between the first circuit board portion and the second circuit board portion, the adhesive material being effective to attach the first circuit board portion to the second circuit board portion during an assembly process, and being further effective to change from a solid state to a liquid state during the assembly process; and at least one annular groove which is formed within the top surface of the first conductive member, the at least one annular groove being effective to entrap at least a portion of the adhesive material when the adhesive material is in a liquid state, thereby substantially preventing the liquefied adhesive material from entering the first region of the circuit board during the assembly process and from interfering with the certain electrical connections.

These and other objects, aspects, and advantages of the present invention will become apparent upon reading the following detailed description in combination with the accompanying drawings.

DETAILED DESCRIPTION OF THE PREFERRED EMBODIMENT OF THE INVENTION

Figure 1:
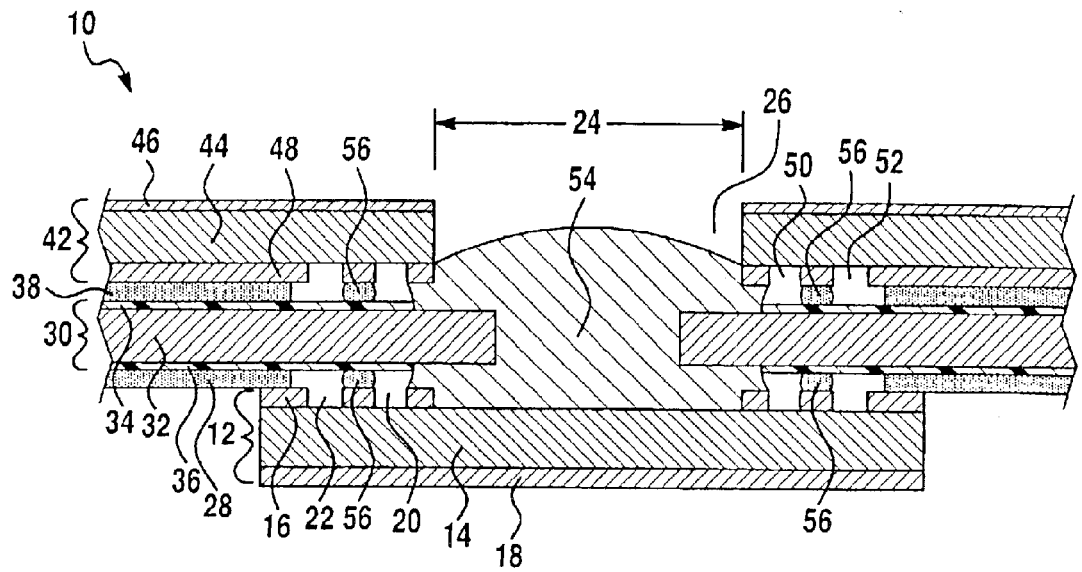
FIG. 1 is a sectional side view of a multi-layer circuit board assembly including a via or cavity which is formed in accordance with the teachings of a first embodiment of the invention.

Referring now to FIG. 1, there is shown a circuit board assembly 10 made in accordance with the teachings of a first embodiment of the invention. Circuit board assembly 10 is formed by "building up" or sequentially adding various layers of certain materials to a pre-circuit assembly, portion or tri-metal film 12. Pre-circuit assembly 12 includes a core metal portion 14, which is preferably manufactured and/or formed from a conventional aluminum material, and a pair of electrically conductive members or layers 16, 18 which are respectively attached to the opposing surfaces (e.g., top and bottom surfaces) of core metal portion 12 and which are preferably manufactured and/or formed from a conventional solderable material (e.g. copper). While copper and aluminum are used to form circuit board 10 in the preferred embodiment of the invention, it should be appreciated that other metals and metal combinations can be used to form circuit board 10 and all of the other circuit boards described herein, and may include metals such as iron, nickel, silver, gold, tin, and alloys thereof. Portions of conductive layer 16 have been selectively removed by a conventional process (e.g., an etching process) to form a pair of annular grooves 20, 22, and from an area or region 24 which forms a portion of aperture or via 26 and which is concentric to grooves or troughs 20, 22.

An adhesive layer or material 28, which in the preferred embodiment of the invention comprise a "Z-flex" adhesive material, is applied to and/or coupled to and substantially "covers" or coats the top surface of conductive member 16.

Circuit board assembly 10 further includes a second circuit portion 30. Circuit portion 30 includes an electrically conductive layer or member 32, which is manufactured and/or formed from an electrically conductive material such as copper or a metallic and electrically conductive foil material, and a pair of layers of dielectric material or conventional epoxy 34, 36, which are respectively applied/ coupled to and "cover" the "top" and "bottom" surfaces of member 32. The bottom surface of dielectric layer 36 is coupled to adhesive layer 28, and a layer of adhesive material 38, which in the preferred embodiment of the invention comprise a "Z-flex" adhesive material, is applied to and/or coupled to and substantially "covers" or coats the top surface of epoxy layer 34.

Circuit board assembly 10 further includes a pre-circuit assembly 42 which is substantially identical to pre-circuit assembly 12. Particularly, pre-circuit assembly 42 includes a core metal portion 44, which is preferably manufactured and/or formed from a conventional aluminum material, and a pair of electrically conductive members or layers 46, 48 which are respectively attached to the opposing surfaces (e.g., top and bottom surfaces) of core metal portion 42 and which are preferably manufactured and/or formed from a conventional solderable material (e.g. copper). The bottom surface of layer 48 is attached to adhesive material 38. Portions of conductive layer 48 have been selectively removed by a conventional process (e.g., an etching process) to form a pair of annular grooves or troughs 50, 52, and from an area or region 24 which forms a portion of aperture or via 26, which is concentric to grooves 50, 52.

Certain portions of pre-circuit assembly 42, electrically conductive member 32, dielectric layers 34, 36, adhesive material 28, 38 and conductive member 16 have been removed from an area or region 24 of the circuit assembly 10 in a known and conventional manner such as by drilling, punching, and/or selective etching, thereby creating a cavity, aperture or via 26 within circuit assembly 10. As shown, electrically conductive member 32 projects and/or remains within area or region 24, thereby allowing an electrical connection to be made member 32 through via or cavity 26. Particularly, an electrically conductive material 54 (i.e., solder) can be disposed or placed within via 26, thereby allowing for the selective formation of desired interconnection strategies and/or component connection strategies.

In the preferred embodiment of the invention, circuit assembly 10 is assembled and/or formed in the following manner. Pre-circuit assembly 12 is provided or formed in a conventional manner, and annular grooves 20, 22 are etched, formed or machined into conductive member or layer 16. The portion of layer 16 residing in region 24 may also be removed at this time in a similar manner. Next, circuit portion 30 is formed or provided and portions of circuit portion 30 residing in area 24 are removed in a conventional manner (e.g., punched, stamped, machined, etched, and/or drilled). Adhesive material 28 is then applied and/or attached to the top surface of member 16 and/or to the bottom surface of dielectric layer 36 in a conventional manner. In the preferred embodiment, circuit portion 30 is then connected, coupled, and/or attached to pre-circuit assembly 12 by use of adhesive material 28 and a known and conventional laminating process such as a conventional "one-step" laminating process. During the lamination process, the heat and pressure applied to the circuit assembly causes the adhesive material 28 to liquefy and to flow inward toward region 24. The grooves 20, 22 in member 16 act to "entrap" and/or hold the liquefied adhesive material, and are effective to prevent material 28 from entering region 24 and potentially covering portions of the conducting surfaces or layers within the via 26. Additionally, as adhesive material 28 flows into grooves 20, 22, it experiences a release of pressure, which tends to return adhesive material 28 into its solid or semi-solid state. This "re-solidified" adhesive material forms "occlusions" or "clots" 56 which act as a further barrier, effective to block liquefied material 28 from entering region 24. In this manner, grooves or troughs 20, 22 substantially prevent adhesive material 18 from flowing inside the via 26 during the lamination process, thereby substantially preventing the adhesive 18 from contaminating the solderable areas within via 26. In other alternate embodiments, different or additional grooves may be used to provide additional opportunities for adhesive material 28 to solidify and additional cross-sectional area for adhesive "entrapment".

After portion 30 and pre-circuit assembly 12 are coupled together, pre-circuit assembly 42 is provided and/or formed and grooves 50, 52 are formed within assembly 42 in a conventional manner. Portions of pre-circuit assembly 42 residing in area 24 may also be removed at this time in a conventional manner. Next, adhesive material 38 is applied and/or attached to the top surface of dielectric layer 34 and/or to the bottom surface of conductive member 48 in a conventional manner. In the preferred embodiment, pre-circuit assembly 42 is then connected, coupled, and/or attached to portion 30 by use of adhesive material 38 and a known and conventional laminating process such as a conventional "one-step" laminating process. During the lamination process, the heat and pressure applied to the circuit assembly causes the adhesive material 38 to liquefy and to flow inward toward region 24. The grooves 50, 52 in member 48 act in a substantially identical manner to grooves 20, 22 to "entrap" and/or hold the liquefied adhesive material, and are effective to prevent material 38 from entering region 24 and potentially covering portions of the conducting surfaces or layers within the via 26. In other alternate embodiments, pre-circuit assemblies 12, 42 and circuit portion 30 may be attached or connected together in a different order to form circuit assembly 10.

Figure 2:
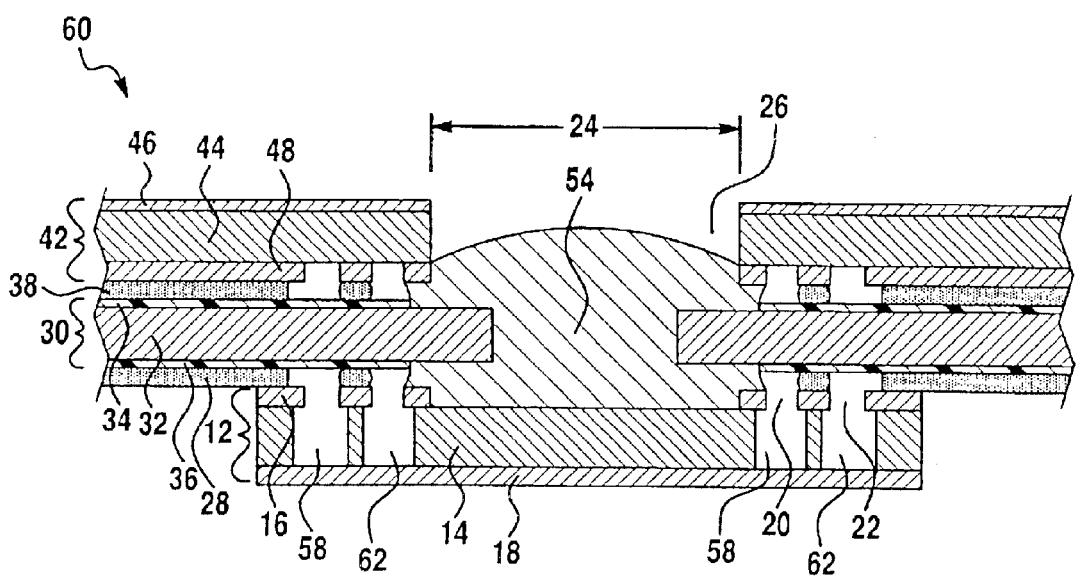
FIG. 2 is a sectional side view of a multi-layer circuit board assembly including a via or cavity which is formed in accordance with the teachings of a second embodiment of the invention.

Referring now to FIG. 2, there is shown a circuit assembly 60 which is formed in accordance with the teachings of a second embodiment of the present invention. Circuit assembly 60 is substantially identical to circuit assembly 10 with the exception of annular grooves or troughs 58, 62, which are pre-etched into aluminum member 14. Circuit assembly 60 is formed or assembled in a substantially identical manner as circuit assembly 10. Grooves 58, 62 respectively communicate with grooves 20, 22 and cooperate with grooves 20, 22 to provide additional volume or area to entrap liquefied adhesive material and prevent material 18 from flowing into via 26.

Figure 3A:
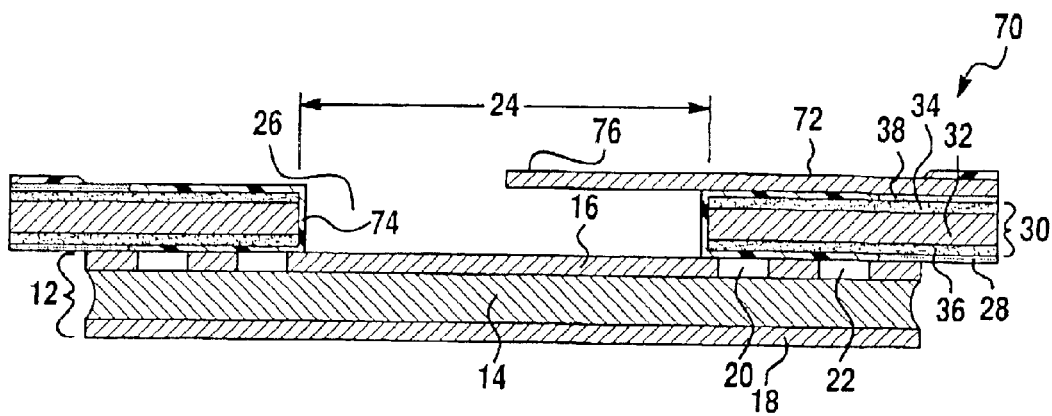
FIG. 3(a) is a sectional side view of a multi-layer circuit board assembly including a via or cavity which is formed in accordance with the teachings of a third embodiment of the invention.
Figure 3B:
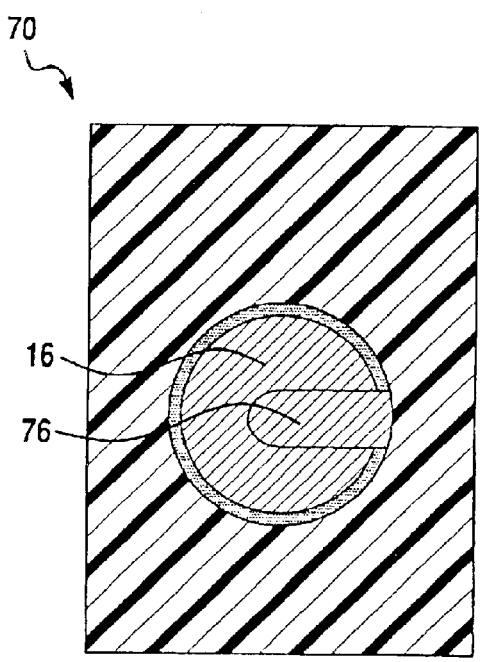
FIG. 3(b) is a top view of the circuit board assembly shown in FIG. 3(a)
Figure 3C:
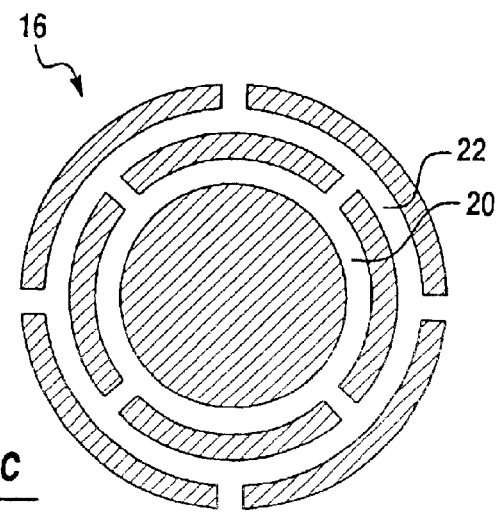
FIG. 3(c) is a top view of a portion of a conductive member or layer used within the circuit board assembly shown in FIG. 3(a)

Referring now to FIGS. 3(*a*)–(*c*), there is shown a circuit board assembly 70 which is formed in accordance with the teachings of a third embodiment of the present invention. Circuit board assembly 70 is substantially identical to circuit board assembly 10 with the exception that pre-circuit assembly 42 has been replaced with conductive member or layer 72 and a solder mask material 74 has been applied to portions of conductive member 32 and/or circuit portion 30 within region 24. Furthermore, the portion of conductive layer 16 residing within region 24 has not been removed and remains "exposed" within via or aperture 26.

In one non-limiting embodiment, conductive member 72 is formed from a copper material. A portion of member 72 is removed from region 24 and forms via 26. A portion, "tab", or protrusion 76 of member 72 (e.g., that portion of member 72 not removed from portion 24) remains substantially and horizontally "suspended" and/or extends within region 24. Protrusion 76 may be formed, designed and/or shaped in a variety of manners, and assists in the forming of a connection between member 72 and member 16 when solder material or other conductive material is selectively inserted into aperture 26. Particularly, protrusion 76 improves solder wetting within the via 26 (i.e., the gap which is formed between protrusion 76 and conductive layer 16 is effective to attract and/or "draw in" fluids such as molten solder, thereby promoting the joining and/or connection of conductive layer 72 and conductive layer 16). Solder mask material 74 substantially prevents solder or other conductive material which is selectively inserted into aperture 26 from "wetting" or metallurgically bonding with conductive member 32.

In the preferred embodiment of the invention, circuit assembly 70 is formed in the following manner. First, pre-circuit assembly 12 is provided or formed in a conventional manner, and annular grooves 20, 22 are etched, formed or machined into conductive member or layer 16. Next, circuit portion 30 is formed or provided and portions of circuit portion 30 residing in area 24 are removed in a conventional manner (e.g., punched, stamped, machined, etched, and/or drilled). In one non-limiting embodiment, solder mask material 74 is applied to circuit portion 30 at this time. In other alternate embodiments, solder mask material 74 may be applied in later steps. Adhesive material 28 is then applied and/or attached to the top surface of member 16 and/or to the bottom surface of dielectric layer 36 in a conventional manner. In the preferred embodiment, circuit portion 30 is then connected, coupled, and/or attached to pre-circuit assembly 12 by use of adhesive material 28 and a known and conventional laminating process such as a conventional "one-step" laminating process. During the lamination process, the heat and pressure applied to the circuit assembly causes the adhesive material 28 to liquefy and to flow inward toward region 24. The grooves 20, 22 in member 16 act to "entrap" and/or hold the liquefied adhesive material, and are effective to prevent material 28 from entering region 24 and potentially covering portions of the conducting surfaces or layers within the via 26 in a substantially identical manner as previously described with respect to circuit board assembly 10. Conductive layer or member 72 is then provided and is attached to circuit portion 30 by use of adhesive material 38.

Figure 4A:
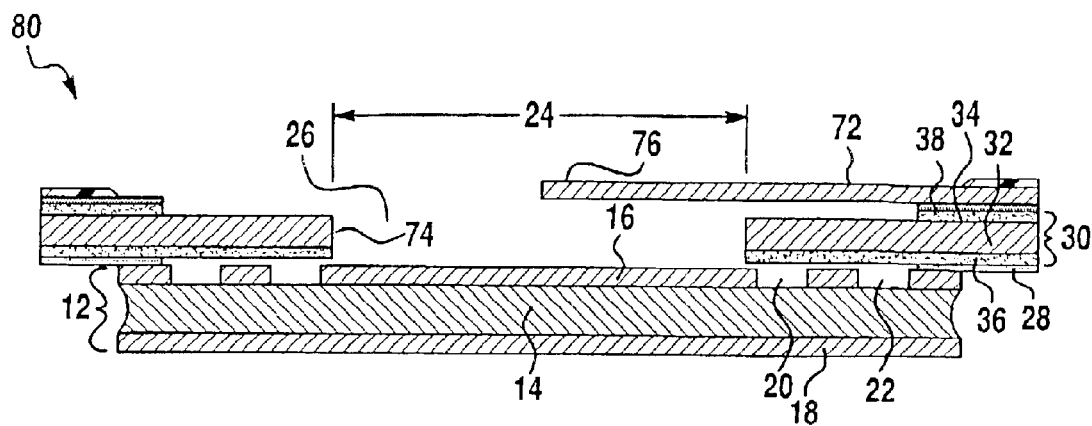
FIG. 4(a) is a sectional side view of a multi-layer circuit board assembly including a via or cavity which is formed in accordance with the teachings of a fourth embodiment of the invention.
Figure 4B:
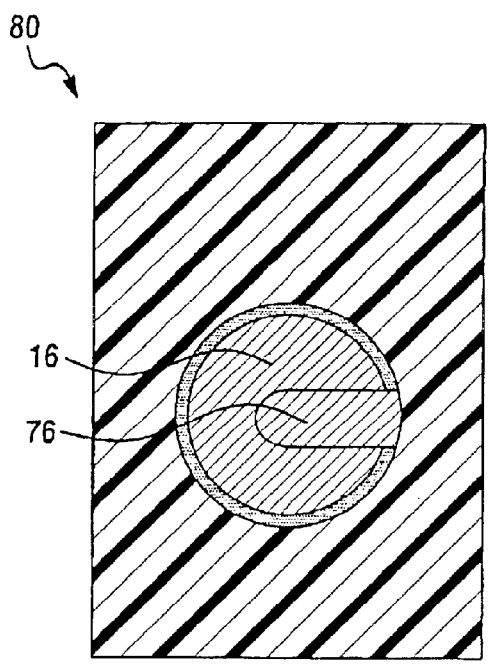
FIG. 4(b) is a top view of the circuit board assembly shown in FIG. 4(a)
Figure 4C:
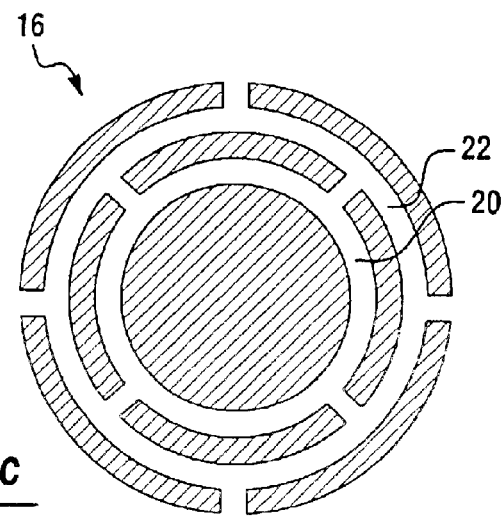
FIG. 4(c) is a top view of a portion of a conductive member or layer used within the circuit board assembly shown in FIG. 4(a)

Referring now to FIGS. 4(*a*)–(*c*), there is shown a circuit board assembly 80 which is formed in accordance with the teachings of a fourth embodiment of the present invention. Circuit board assembly 80 is substantially identical to circuit board assembly 70 with the exception that solder mask material 74 has been removed from conductive member 32, thereby allowing a connection to be formed between conductive member 72, conductive member 32 and conductive member 16. Particularly, when solderable material is inserted into via 26, it is effective to connect members 72, 32, and 16. Additionally, a portion of dielectric material 34 has been removed from the top surface of conductive member 32 and is effective to provide additional surface area for solderable material to metallurgically bond to, thereby providing a more robust and reliable connection. Circuit assembly 80 is assembled in a manner substantially similar to circuit assembly 70, and grooves 20, 22 act in a substantially similar manner to prevent adhesive 28 from entering into region 24 during the assembly (i.e., lamination) process.

Figure 5A:
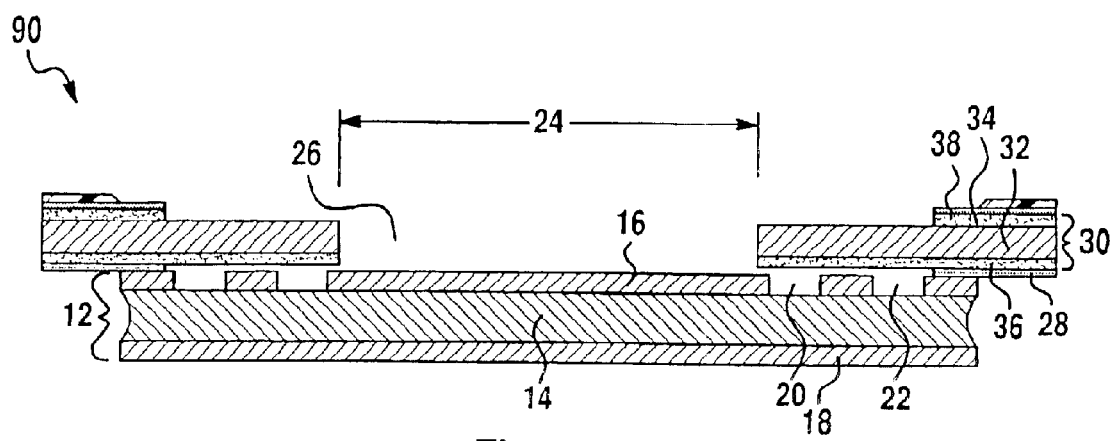
FIG. 5(a) is a sectional side view of a multi-layer circuit board assembly including a via or cavity which is formed in accordance with the teachings of a fifth embodiment of the invention.
Figure 5B:
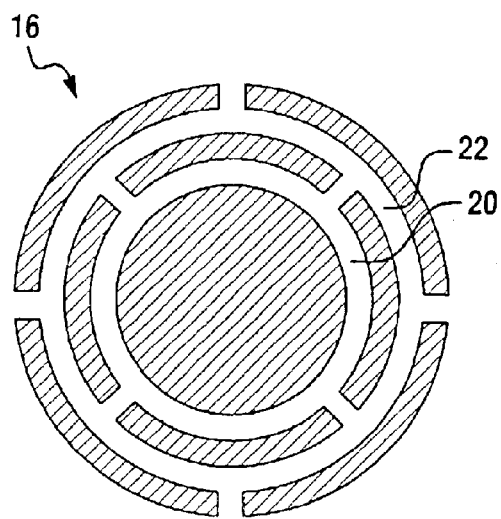
FIG. 5(b) is a top view of a portion of a conductive member or layer used within the circuit board assembly shown in FIG. 5(a).

Referring now to FIGS. 5(*a*) and (*b*), there is shown a circuit board assembly 90 which is formed in accordance with the teachings of a fifth embodiment of the present invention. Circuit board assembly 90 is substantially identical to circuit board assembly 80 with the exception that conductive member 72 is not included within circuit assembly 90. When solderable material is inserted into via 26, it is effective to connect members 32 and 16. Circuit assembly 90 is assembled in a manner substantially similar to circuit assembly 80, and grooves 20, 22 act in a substantially similar manner to prevent adhesive 28 from entering into region 24 during the assembly (i.e., lamination) process.

It should be understood that the invention is not limited to the exact embodiment or construction which has been illustrated and described but that various changes may be made without departing from the spirit and the scope of the invention.

What is claimed is:

1. A circuit board assembly including an aperture in which certain electrical connections can be made, said circuit board assembly comprising:
    a first circuit board portion including a first conductive member having a top surface;
    a second circuit board portion having a bottom surface arid a first region which forms a portion of said aperture;
    an adhesive material which is at least partially disposed between said first circuit board portion and said second circuit board portion, said adhesive material being effective to attach said first circuit board portion to said second circuit board portion during an assembly process, and being further effective to substantially liquefy during said assembly process; and
    at least one annular groove which is formed within said top surface of said first conductive member, said at least one annular groove being effective to entrap at least a portion of said liquefied adhesive material, thereby substantially preventing said liquefied adhesive material from entering said first region of said circuit board during said assembly process and from interfering with said certain electrical connections.

2. The circuit board assembly of claim 1 wherein said first circuit board portion further comprises a second conductive member and a core member which is disposed between said first conductive member and said second conductive member.

3. The circuit board assembly of claim 2 wherein said core member is formed from an aluminum material.

4. The circuit board assembly of claim 3 wherein said first and second conductive members are formed from a copper material.

5. The circuit board assembly of claim 2 wherein said second circuit board portion comprises a first and second dielectric layer and a third conductive member which is disposed between said first and second dielectric layers.

6. The circuit board assembly of claim 5 further comprising:
    solder material which is disposed within said aperture and which is effective to provide an electrical connection between said third conductive member and said first conductive member.

7. The circuit board assembly of claim 2 further comprising:
    at least one second annular groove within said core member, said at least one second annular groove communicating with said at least one first annular groove and being effective to trap additional liquefied adhesive material.

8. A circuit board assembly comprising:
    a circuit portion including a first and a second dielectric layer and a first conductive member disposed between said first and second dielectric layer, wherein said circuit portion includes at least one via within a first region,
    a Z-flex material which is disposed upon selective portions of said second dielectric layer, wherein at least a portion of said Z-flex material is liquefied by a laminating process;
    a pre-circuit assembly including a core member having a top surface and a bottom surface, a second conductive member attached to said top surface, and a third conductive
    at least one groove which is formed within said second conductive member, said at least one groove being disposed around said at least one via, wherein said at least one groove is effective to retain said liquefied Z-flex material and prevent said liquefied Z-flex material from entering said at least one via.

9. The circuit board assembly of claim 8 further comprising:
    as second Z-flex material which is disposed upon selective portions of said first dielectric layer, wherein at least a portion of said second Z-flex material is liquefied by said laminating process;
    a second pre-circuit assembly including a second core member having a top surface and a bottom surface, a fourth conductive member attached to said top surface of said second core member, and a fifth conductive member attached to said bottom surface of said second core member, wherein said second pre-circuit assembly is coupled to said circuit portion such that said second adhesive material resides between said first dielectric layer and said fifth conductive member;
    at least one second groove which is formed within said fifth conductive member, said at least one second groove being disposed around said at least one via, wherein said at least one second groove is effective to retain said liquefied second Z-flex material and prevent said liquefied second Z-flex material from entering said at least one via.

10. The circuit board assembly of claim 8 further comprising:
    at least one third groove within said core member, said at least one third groove communicating with said at least one first groove and being effective to retain additional liquefied Z-flex material.

11. The circuit board assembly of claim 8 further comprising a certain electrically conductive solder material which is selectively placed within said at least one via effective to connect said second conductive member to said first conductive member.

12. The circuit board of assembly of claim 8 further comprising:
    a fourth conductive member which is coupled to said first dielectric layer by use of an adhesive material, wherein at least a portion of said fourth conductive member extends into said at least one via.

13. A circuit board assembly comprising:
    a first electrically conductive core member having a top and a bottom surface;
    a first electrically conductive and solderable layer which is coupled to said top surface, said first layer having a first pair of annular grooves which expose a portion of said core member;
    a second electrically conductive and solderable layer which is coupled to said bottom surface;
    a first pre-circuit assembly having a second core member having a top and bottom surface and a pair of dielectric layers which are respectively disposed upon said top and bottom surface of said second core member, said first pre-circuit assembly further having an aperture which is concentric with said first pair of annular grooves;

a first layer of adhesive material which is disposed upon said first electrically conductive and solderable layer, said first layer of adhesive material being effective to couple said bottom layer of dielectric material of said precircuit assembly to said first electrically conductive and solderable layer, wherein said adhesive material may be selectively liquefied during an assembly process.

14. The circuit board assembly of claim 13 wherein said adhesive material is a Z-flex adhesive material.

15. The circuit board assembly of claim 13 wherein said first core member further includes a second pair of annular grooves which are substantially aligned with communicate with said first pair of annular grooves formed within said first electrically conductive layer, said second pair of annular grooves traverse said first core member to expose a portion of said second electrically conductive layer, effective to enlarge the volume of said first pair of annular grooves.

16. The circuit board assembly of claim 13 wherein said aperture in said first pre-circuit assembly exposes a portion of said first electrically conductive and solderable layer, said circuit board assembly further comprising:

an amount of solder mask material which is disposed upon said first pre-circuit assembly within said aperture; and a third electrically conductive member which is coupled to said first pre-circuit assembly opposite to said first electrically conductive member, wherein said third electrically conductive member having a portion which extends above said aperture.

* * * * *

UNITED STATES PATENT AND TRADEMARK OFFICE
CERTIFICATE OF CORRECTION

| | |
|---|---|
| PATENT NO. | : 6,838,623 B2 |
| APPLICATION NO. | : 10/300049 |
| DATED | : January 4, 2005 |
| INVENTOR(S) | : Lawrence Kneisel et al. |

It is certified that error appears in the above-identified patent and that said Letters Patent is hereby corrected as shown below:

On the Title Page

In column 1, item (75), delete "Jairazboy," and substitute --Jairazbhoy,-- in its place.

In the Claims

In claim 1, line 7, before "a first" delete "arid" and substitute --and-- in its place.

In claim 8, line 14, after "conductive" insert --member attached to said bottom surface, wherein said pre-circuit assembly is coupled to said circuit portion such that said Z-flex material resides between said second dielectric layer and said second conductive member; and--.

In claim 9, line 3, before "second" delete "as" and substitute --a-- in its place.

Signed and Sealed this

Twenty-eighth Day of August, 2007

JON W. DUDAS
*Director of the United States Patent and Trademark Office*